(12) United States Patent
Teo et al.

(10) Patent No.: US 7,692,213 B2
(45) Date of Patent: Apr. 6, 2010

(54) INTEGRATED CIRCUIT SYSTEM EMPLOYING A CONDENSATION PROCESS

(75) Inventors: Lee Wee Teo, Singapore (SG); Yung Fu Chong, Singapore (SG); Elgin Kiok Boone Quek, Singapore (SG); Alain Chan, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 233 days.

(21) Appl. No.: 11/835,059

(22) Filed: Aug. 7, 2007

(65) Prior Publication Data
US 2009/0039388 A1  Feb. 12, 2009

(51) Int. Cl.
*H01L 29/778* (2006.01)
(52) U.S. Cl. .............. 257/190; 257/E21.335; 257/E21.345; 257/E21.427; 257/E21.112

(58) Field of Classification Search .......... 257/E21.427, 257/E29.325–E29.346, 213–413, 900, 902–903
See application file for complete search history.

(56) References Cited

U.S. PATENT DOCUMENTS

| 7,226,820 B2 * | 6/2007 | Zhang et al. ............. 438/149 |
| 2004/0007724 A1 | 1/2004 | Murthy et al. |
| 2006/0170016 A1 | 8/2006 | Mathew et al. |
| 2008/0042209 A1 * | 2/2008 | Tan et al. ............. 257/369 |

* cited by examiner

*Primary Examiner*—Wai-Sing Louie
*Assistant Examiner*—Sue Tang
(74) *Attorney, Agent, or Firm*—Mikio Ishimaru

(57) ABSTRACT

An integrated circuit system that includes: providing a PFET device including a PFET gate and a PFET gate dielectric; forming a source/drain extension from a first epitaxial layer aligned to a first PFET gate sidewall spacer; and forming a source/drain from a second epitaxial layer aligned to a second PFET gate sidewall spacer.

18 Claims, 8 Drawing Sheets

INTEGRATED CIRCUIT SYSTEM EMPLOYING A CONDENSATION PROCESS

TECHNICAL FIELD

The present invention relates generally to integrated circuits, and more particularly to an integrated circuit system employing a condensation process.

BACKGROUND ART

Integrated circuits find application in many of today's consumer electronics, such as cellphones, video cameras, portable music players, printers, computers, etc. Integrated circuits may include a combination of active devices, passive devices and their interconnections.

A common active device within an integrated circuit is the metal-oxide-semiconductor field-effect transistor (MOSFET), which is commonly referred to as a field-effect transistor (FET). A MOSFET generally includes a semiconductor substrate, having a source, a drain, and a channel located between the source and drain. A gate stack including a conductive material (i.e.—a gate) and an oxide layer (i.e.—a gate oxide) are typically located above the channel. During operation, an inversion layer forms a conducting bridge or "channel" between the source and drain when an appropriate voltage is applied to the gate. Both p-channel and n-channel MOSFET technologies are available and can be combined on a single substrate in one technology, called complementary-metal-oxide-semiconductor or CMOS.

As the semiconductor industry moves towards 45 nanometer node technologies and beyond, there are a few factors that will increase the gain of these MOSFET devices. One such factor is the introduction of strain to the channel of a MOSFET device by forming a strained material adjacent the channel region. In conventional processes, the strained material is formed by an epitaxial process within source/drain extensions and source/drain regions and typically contains a uniform concentration profile (e.g.—for germanium). Unfortunately, these conventional processes fail to maximize the strain inducing effect that different concentration levels for the source/drain extensions and the source/drain regions can have on the channel.

Thus, a need still remains for a reliable integrated circuit system and method of fabrication, wherein the integrated circuit system enhances strain within a channel region by forming source/drain extensions and source/drain regions with different concentration levels. In view of the ever-increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit system including: providing a PFET device including a PFET gate and a PFET gate dielectric; forming a source/drain extension from a first epitaxial layer aligned to a first PFET gate sidewall spacer; and forming a source/drain from a second epitaxial layer aligned to a second PFET gate sidewall spacer.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
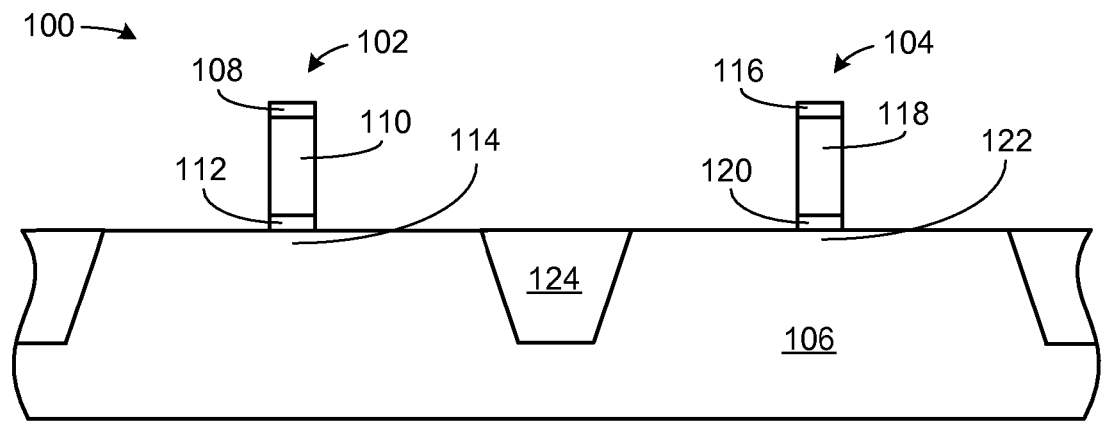
FIG. 1 is a cross sectional view of an integrated circuit system in an initial stage of manufacture, in accordance with an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention.

However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown exaggerated in the drawing FIGs. Additionally, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

The terms "example" or "exemplary" are used herein to mean serving as an instance or illustration. Any aspect or embodiment described herein as an "example" or as "exemplary" is not necessarily to be construed as preferred or advantageous over other aspects or designs.

The term "system" as used herein means and refers to the method and to the apparatus of the present invention in accordance with the context in which the term is used.

FIGS. 1-11, which follow, depict by way of example and not by limitation, an exemplary process flow for the formation of an integrated circuit system and they are not to be construed as limiting. It is to be understood that a plurality of conventional processes that are well known within the art and not repeated herein, may precede or follow FIGS. 1-11. Moreover, it is to be understood that many modifications, additions, and/or omissions may be made to the below described process without departing from the scope or spirit of the claimed subject matter. For example, the process may include more, fewer, or other steps.

Additionally, it is to be appreciated that the present disclosure need not be limited to the initial integrated circuit system depicted by FIG. 1. Accordingly, the present invention may include any p-channel multi-electrode device in which the current flowing between two specified electrodes is controlled or modulated by the voltage applied at a control electrode. For example, the p-channel multi-electrode device may include a p-channel field-effect-transistor (PFET), such as a single-gate transistor, a multi-gate transistor, a fin-FET, or an annular gate transistor. Moreover, it is to be understood that one or more of the integrated circuit system could be prepared at one time on a medium, which could then be separated into individual or multiple integrated circuit assemblies at a later stage of fabrication.

Referring now to FIG. 1, therein is shown a cross sectional view of an integrated circuit system 100 in an initial stage of manufacture, in accordance with an embodiment of the present invention. The integrated circuit system 100 can be formed from conventional deposition, patterning, photolithography, and etching to form an n-channel field-effect-transistor, such as an NFET device 102, and a PFET device 104. The NFET device 102 and the PFET device 104 may operate together, thereby forming a complementary metal-oxide-semiconductor (CMOS) configuration.

The NFET device 102 and the PFET device 104 are formed on and/or within a substrate 106. In an aspect of the present invention, the substrate 106 may include any semiconducting material, for example, Si, SiC, SiGe, Si/SiGe, SiGeC, Ge, GaAs, InAs, InP as well as other III/V or II/VI compound semiconductors. Moreover, the substrate 106 may also include silicon-on-insulator configurations.

In a preferred aspect of the embodiment, the substrate 106 is a silicon-containing substrate. The term "silicon-containing substrate" is used herein to denote a semiconductor material that includes at least silicon. Examples of a silicon-containing substrate include, but are not limited to: Si, SiGe, SiC, and/or SiGeC.

In alternative aspects of the embodiment, the substrate 106 may also include doped, undoped, or doped and undoped regions therein. The substrate 106 may also include one or more crystal orientations.

However, the examples provided for the substrate 106 are not to be construed as limiting and the composition of the substrate 106 may include any material that physically and electrically enables the formation of an active or passive device structure.

The NFET device 102 includes an NFET cap 108, an NFET gate 110, and an NFET gate dielectric 112. The NFET cap 108 is formed over the NFET gate 110 and protects the NFET gate 110 from subsequent processing steps and may include a dielectric material, such as silicon nitride, for example. The NFET gate 110 may be formed from conventional materials including doped and undoped semiconducting materials (such as, for example, polySi, amorphous Si, or SiGe), a metal, a metallic alloy, a silicide, or a combination thereof.

The NFET gate dielectric 112 may be made from materials including, but not limited to, silicon oxide, silicon oxynitride, silicon nitride, a silicon oxide/nitride/oxide stack or a high-k dielectric material (i.e.—one having a dielectric constant value greater than silicon oxide). However, it is to be understood that the type of material chosen for the NFET gate dielectric 112 is not limited to the above examples; for example, the NFET gate dielectric 112 may include any material that permits induction of a charge in an NFET channel 114 when an appropriate voltage is applied to the NFET gate 110.

The PFET device 104 includes a PFET cap 116, a PFET gate 118, and a PFET gate dielectric 120. The PFET cap 116 is formed over the PFET gate 118 and protects the PFET gate 118 from subsequent processing steps and may include a dielectric material, such as silicon nitride, for example. The PFET gate 118 may be formed from conventional materials including doped and undoped semiconducting materials (such as, for example, poly-silicon, amorphous silicon, or SiGe), a metal, a metallic alloy, a silicide, or a combination thereof.

The PFET gate dielectric 120 may be made from materials including, but not limited to, silicon oxide, silicon oxynitride, silicon nitride, a silicon oxide/nitride/oxide stack or a high-k dielectric material (i.e.—one having a dielectric constant value greater than silicon oxide). However, it is to be understood that the type of material chosen for the PFET gate dielectric 120 is not limited to the above examples; for example, the PFET gate dielectric 120 may include any material that permits induction of a charge in a PFET channel 122 when an appropriate voltage is applied to the PFET gate 118.

The substrate 106 may also include an isolation structure 124, such as a shallow trench isolation structure, which can electrically isolate and/or separate the NFET device 102 and the PFET device 104. For purposes of illustration, the isolation structure 124 may be made from a dielectric material such as silicon dioxide ("SiO$_2$").

Figure 2:
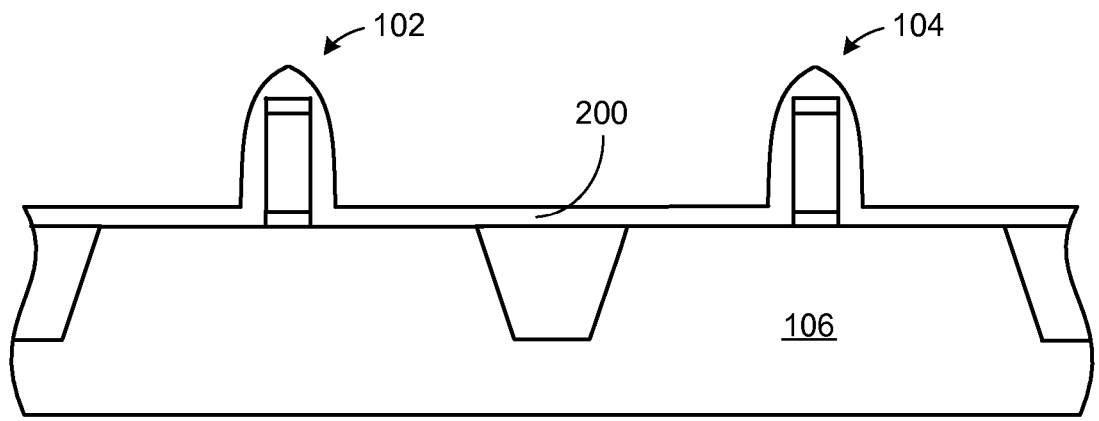
FIG. 2 is the structure of FIG. 1 after formation of a first insulation layer.

Referring now to FIG. 2, therein is shown the structure of FIG. 1 after formation of a first insulation layer 200. The first insulation layer 200 can be deposited over the NFET device 102, the PFET device 104, and the substrate 106 with a thickness of about 2 nanometers to about 20 nanometers. However, it is to be understood that the thickness of the first insulation layer 200 is not to be limited by the above exemplary range. In accordance with the scope of the present invention, the first insulation layer 200 may include any thickness and is only to be limited by the desired width of a subsequently formed gate sidewall spacer.

It is to be understood that by strategically controlling and modulating the thickness of the first insulation layer 200 that the width of subsequently formed gate sidewall spacers at the interface with the substrate 106 can be carefully controlled.

By way of example, the first insulation layer 200 may include dielectric materials such as a silicon dioxide or silicon nitride. However, it is to be understood that the present invention is not to be limited to this particular example. In accordance with the invention, the first insulation layer 200 may include any material that helps to block the deposition of a subsequent layer, such as a silicon germanium layer, for example.

Figure 3:
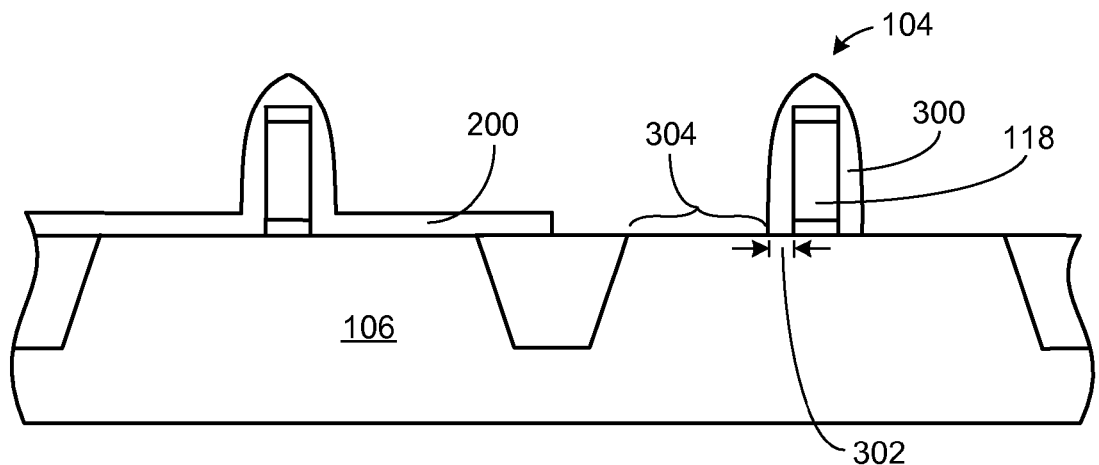
FIG. 3 is the structure of FIG. 2 after selective etching of a first insulation layer.

Referring now to FIG. 3, therein is shown the structure of FIG. 2 after selective etching of the first insulation layer 200. The etch process forms a first PFET gate sidewall spacer 300 by removing selected portions of the first insulation layer 200 formed adjacent the PFET device 104. After etching, the first PFET gate sidewall spacer 300 should have a first width dimension 302 (e.g.—a thickness) of about 2 nanometers to about 20 nanometers at its interface with the substrate 106.

However, it is to be understood that the present invention is not to be limited to the exemplary range provided above for the first width dimension 302. In accordance with the invention, the first width dimension 302 may include any thickness that optimizes the gain inducing strain effect that a subsequently deposited source and drain extension may have on the PFET channel 122.

Per this embodiment, the first width dimension 302 can be defined as the thickness of the first PFET gate sidewall spacer 300 at its interface with the substrate 106.

It is to be understood that the first width dimension 302 of the first PFET gate sidewall spacer 300 helps to determine an offset (e.g.—a distance substantially equivalent to the first width dimension 302) of a first active region 304 from the PFET gate 118. By selectively removing portions of the first insulation layer 200 (i.e.—by etching the first insulation layer 200 to form the first PFET gate sidewall spacer 300) the first active region 304 has been defined and exposed for further processing. It is to be understood that the first width dimension 302 is inversely correlated with the size of the first active region 304 exposed. For example, as the first width dimension 302 of the first PFET gate sidewall spacer 300 decreases, the size of the first active region 304 increases. The exposed portions of the first active region 304 may optionally undergo a cleaning step to remove surface contaminants, such as particles, organics and native oxides.

By way of example, the etch process used to selectively etch the first insulation layer 200 may include a dry etch process, such as reactive ion etching. However, it is to be understood that the etch process of the present embodiment is not to be limited to reactive ion etching and the etch method may include any etch process that selectively removes portions of the first insulation layer 200.

Figure 4:
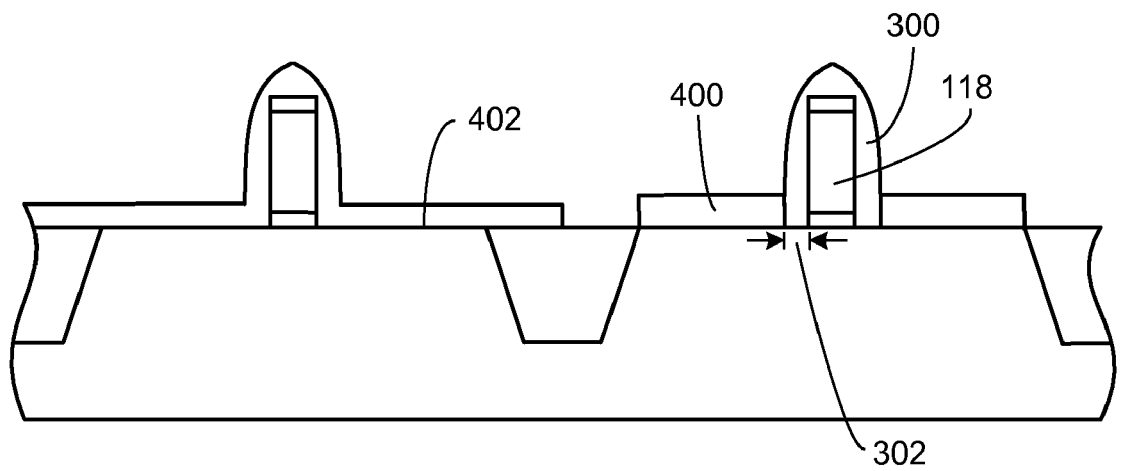
FIG. 4 is the structure of FIG. 3 after the selective formation of a first epitaxial layer over a first active region.

Referring now to FIG. 4, therein is shown the structure of FIG. 3 after the selective formation of a first epitaxial layer 400 over the first active region 304, of FIG. 3. Notably, the proximity of the first epitaxial layer 400 to the PFET gate 118 and its effect on subsequently formed source and drain extensions can be controlled/determined by the first width dimension 302 of the first PFET gate sidewall spacer 300. It is to be understood that the offset of the first epitaxial layer 400 from the PFET gate 118 can be modified or adjusted to effectuate a particular result by altering the first width dimension 302. For example, the offset of the first epitaxial layer 400 from the PFET gate 118 can be modified or adjusted to impact upon the proximity effect that a subsequently formed strained source and drain extension may have upon the PFET channel 122.

The first epitaxial layer 400 can be made from a selective epitaxial growth method that forms raised epitaxial regions above a substrate top surface 402. Generally, the first epitaxial layer 400 may include any material that imparts strain to the PFET channel 122 of the PFET device 104. It will be appreciated by those skilled in the art that an appropriately applied strain to the channel region of a transistor device may enhance the amount of current that can flow through the device.

As an exemplary illustration, the first epitaxial layer 400 may include semiconducting materials, such as silicon and germanium. In an aspect of the embodiment, the first epitaxial layer 400 may include a silicon-germanium layer defined by the following formula: $Si_xGe_{1-x}$, wherein X may range from about 0.05 to about 0.99. In a preferred aspect of the embodiment, the first epitaxial layer 400 employs a silicon-germanium layer with a germanium concentration of about 1 to about 50 atomic percent. Moreover, the first epitaxial layer 400 can optionally be either undoped or doped with a p-type dopant that is selected from Group IIIA of the Periodic Table of Elements, preferably boron.

However, it is to be understood that the first epitaxial layer 400 is not to be limited to any particular type of material, germanium concentration, or dopant. In accordance with the present embodiment, the first epitaxial layer 400 may include any material, germanium concentration, or dopant that is strategically engineered and designed to provide gain inducing strain within the PFET channel 122 of the integrated circuit system 100.

The first epitaxial layer 400 may be deposited with a thickness of about 5 nanometers to about 50 nanometers, for example. However, it is to be understood that the thickness of the first epitaxial layer 400 deposited is not limited to the above exemplary range and may include any thickness that optimally induces strain within the PFET channel 122.

Figure 5:
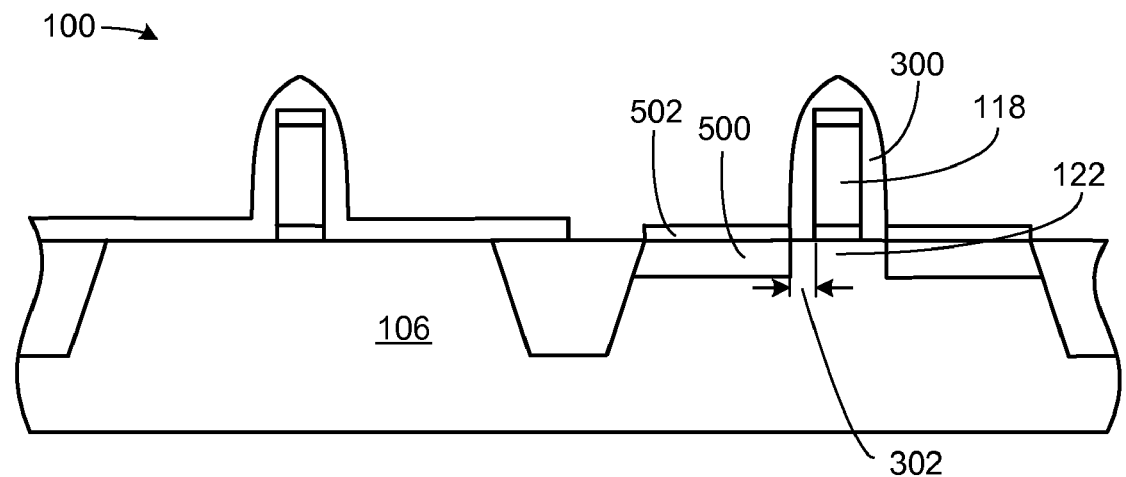
FIG. 5 is the structure of FIG. 4 after forming a source/drain extension.

Referring now to FIG. 5, therein is shown the structure of FIG. 4 after forming a source/drain extension 500. The source/drain extension 500 may include any material that imparts strain to the PFET channel 122 and may have a depth ranging from about 5 nanometers to about 50 nanometers, for example. However, it is to be understood that the depth of the source/drain extension 500 is not limited to the above exemplary range and may include any depth that optimally induces strain within the PFET channel 122 (e.g.—depth can vary with the chosen technology node).

By way of example, the source/drain extension 500 may include a silicon-germanium layer formed via a germanium condensation process. More specifically, the germanium condensation process may include a dry oxidation process performed at elevated temperatures (e.g.—above 750° C.). During this process the first epitaxial layer 400, of FIG. 4, is exposed to an oxidation reaction, which forms an oxide layer 502 and the source/drain extension 500. It will be appreciated by those skilled in the art that a germanium condensation process can have the effect of driving germanium from the first epitaxial layer 400 into the substrate 106, thereby enabling the accurate formation of a silicon-germanium layer (i.e.—the source/drain extension 500) with the desired concentration of germanium.

It has been discovered by the present inventors that a germanium condensation process, as applied to the first epitaxial layer 400, enables the formation of the source/drain extension 500 with a germanium concentration of approximately 10 to approximately 100 atomic percent.

Notably, the present invention not only enables the formation of the source/drain extension 500 with a desired germanium concentration level, but it also permits the selective positioning of the source/drain extension 500 in close proximity to the PFET gate 118 and/or the PFET channel. The present invention achieves this objective by offsetting the source/drain extension 500 from the PFET gate 118 a distance substantially equivalent to the first width dimension 302 of the first PFET gate sidewall spacer 300. It is to be understood that the proximity effect (e.g.—the gain inducing strain) of the source/drain extension 500 can be accurately controlled by the first width dimension 302 of the first PFET gate sidewall spacer 300, thereby improving/enhancing the short channel performance characteristics of the integrated circuit system 100.

Moreover, it has been discovered by the present inventors that by employing the method described herein, that a high germanium concentration region (e.g.—the source/drain extension 500) can be formed without the dislocation effects/formations common to epitaxially formed high germanium concentration regions.

Figure 6:
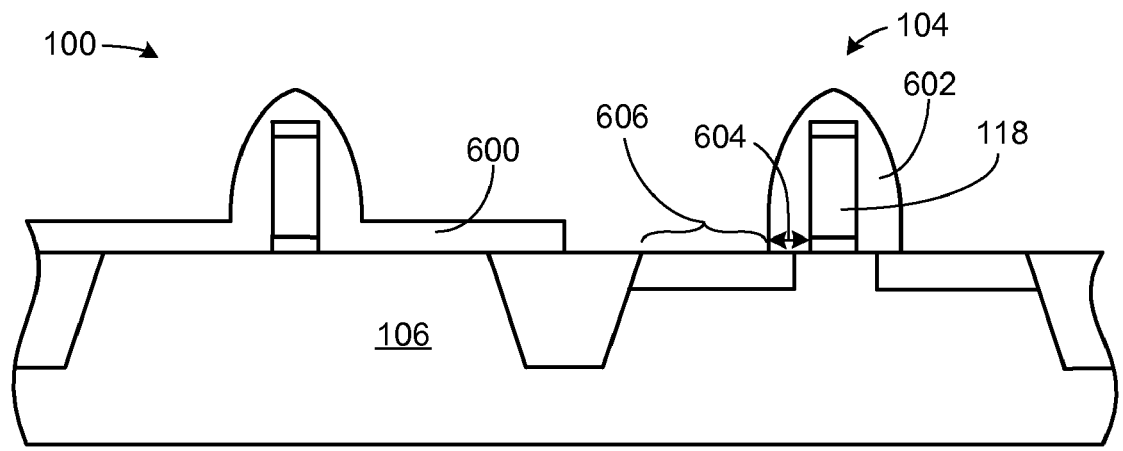
FIG. 6 is the structure of FIG. 5 after further processing.

Referring now to FIG. 6, therein is shown the structure of FIG. 5 after further processing. This illustration depicts the removal of the oxide layer 502, of FIG. 5, the first insulation layer 200, of FIG. 8, and the first PFET gate sidewall spacer 300, of FIG. 5. By way of example, the oxide layer 502, the first insulation layer 200, and the first PFET gate sidewall spacer 300 can be removed by a single step etch process or a multiple step etch process (e.g.—a wet or dry etch process) that is selective to the material chosen for each of the oxide layer 502, the first insulation layer 200, and the first PFET gate sidewall spacer 300.

After removal of the oxide layer 502, the first insulation layer 200, and the first PFET gate sidewall spacer 300, a second insulation layer 600 can be formed over the integrated circuit system 100. The second insulation layer 600 can be deposited over the NFET device 102, the PFET device 104, and the substrate 106 with a thickness of about 30 to about 60 nanometers. However, it is to be understood that the thickness of the second insulation layer 600 is not to be limited by the above exemplary range. In accordance with the scope of the present invention, the second insulation layer 600 may include any thickness and is only to be limited by the desired width of a subsequently formed gate sidewall spacer.

A subsequent etch process forms a second PFET gate sidewall spacer 602 by removing selected portions of the second insulation layer 600 formed adjacent the PFET device 104. After etching, the second PFET gate sidewall spacer 602 should have a second width dimension 604 (e.g.—a thickness) of about 30 nanometers to about 60 nanometers at its interface with the substrate 106.

However, it is to be understood that the present invention is not to be limited to the exemplary range provided above for the second width dimension 604. In accordance with the invention, the second width dimension 604 may include any thickness that optimizes the gain inducing strain effect that a subsequently deposited source and drain may have on the PFET channel 122.

Per this embodiment, the second width dimension 604 can be defined as the thickness of the second PFET gate sidewall spacer 602 at its interface with the substrate 106.

It is to be understood that the second width dimension 604 of the second PFET gate sidewall spacer 602 helps to determine an offset (e.g.—a distance substantially equivalent to the second width dimension 604) of a second active region 606 from the PFET gate 118. By selectively removing portions of the second insulation layer 600 (i.e.—by etching the second insulation layer 600 to form the second PFET gate sidewall spacer 602) the second active region 606 has been defined and exposed for further processing. It is to be understood that the second width dimension 604 is inversely correlated with the size of the second active region 606 exposed. For example, as the second width dimension 604 of the second PFET gate sidewall spacer 602 decreases, the size of the second active region 606 increases. The exposed portions of the second active region 606 may optionally undergo a cleaning step to remove surface contaminants, such as particles, organics and native oxides.

By way of example, the etch process used to selectively etch the second insulation layer 600 may include a dry etch process, such as reactive ion etching. However, it is to be understood that the etch process of the present embodiment is not to be limited to reactive ion etching and the etch method may include any etch process that selectively removes portions of the second insulation layer 600.

Figure 7:
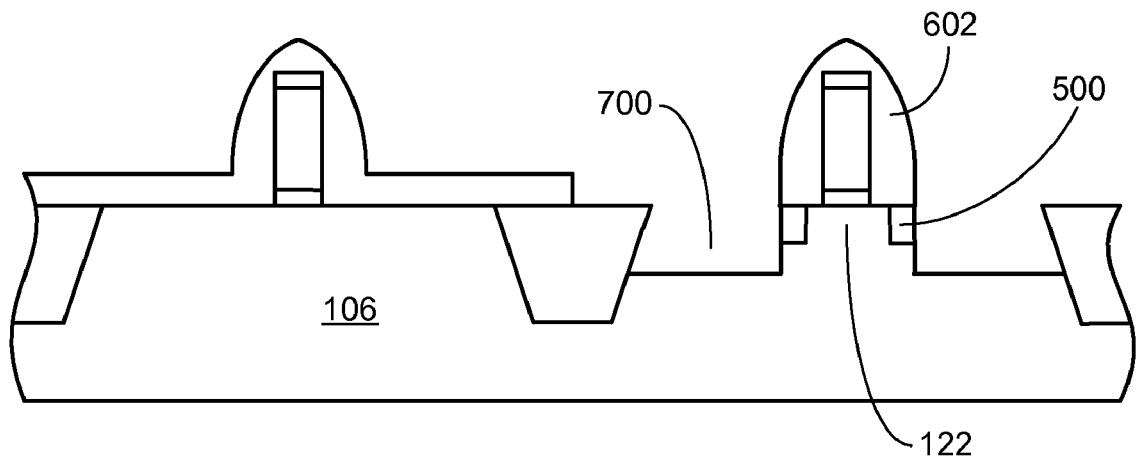
FIG. 7 is the structure of FIG. 6 after forming a recess within a substrate.

Referring now to FIG. 7, therein is shown the structure of FIG. 6 after forming a recess 700 within the substrate 106. During this process step, the recess 700 is formed by an etch process that is highly selective to the material chosen for the source/drain extension 500 and the substrate 106. By way of example, the etch process may include a dry etch process, such as reactive ion etching, which selectively removes silicon-germanium and/or silicon. However, it is to be understood that the etch process of the present embodiment is not to be limited to reactive ion etching and the etch method may include any etch process that selectively removes portions of the source/drain extension 500 and the substrate 106.

Generally, the depth of the recess 700 should exceed the depth of the source/drain extension 500 and may, more specifically, range from about 50 nanometers to about 100 nanometers, for example. However, it is to be understood that the present invention is not to be limited to the exemplary range provided above for the depth of the recess 700. In accordance with the invention, the depth of the recess 700 may include any depth that optimizes the gain inducing strain effect that a subsequently deposited source and drain may have on the PFET channel 122.

Notably, the formation of the recess 700 can be aligned to the second PFET gate sidewall spacer 602, thereby helping to position a subsequently deposited source and drain epitaxial material that can act synergistically with the gain inducing strain caused by the formation of the source/drain extension 500.

Figure 8:
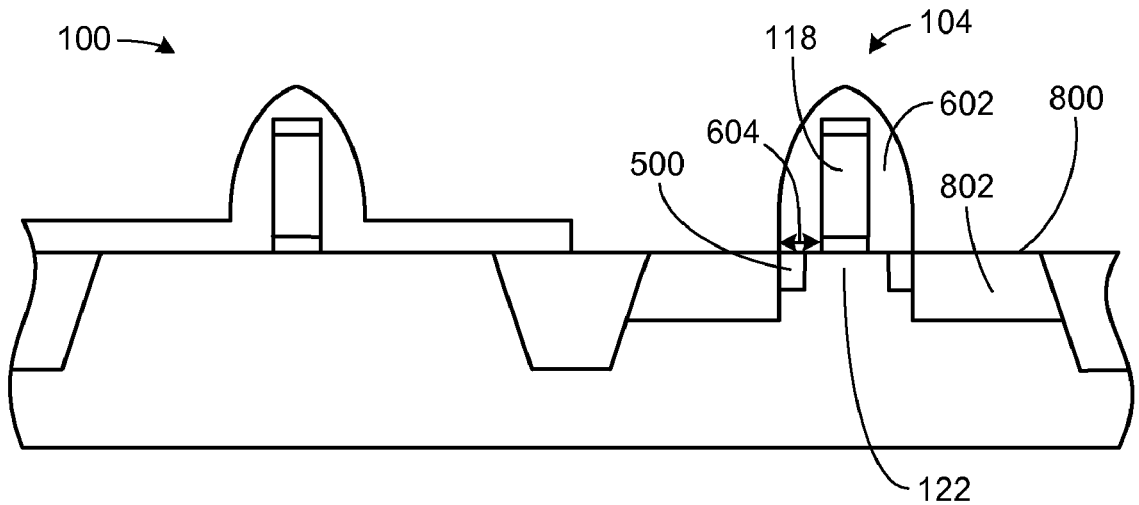
FIG. 8 is the structure of FIG. 7 after the selective formation of a second epitaxial layer within a recess.

Referring now to FIG. 8, therein is shown the structure of FIG. 7 after the selective formation of a second epitaxial layer 800 within the recess 700, of FIG. 7. After deposition, the second epitaxial layer 800 forms a source/drain 802 of the PFET device 104.

Notably, the proximity of the second epitaxial layer 800 (i.e.—the source/drain 802) to the PFET gate 118 and its effect on the source/drain extension 500 can be controlled/determined by the second width dimension 604 of the second PFET gate sidewall spacer 602. It is to be understood that the offset of the second epitaxial layer 800 from the PFET gate 118 can be modified or adjusted to effectuate a particular result by altering the second width dimension 604. For example, the offset of the source/drain 802 from the PFET gate 118 can be modified or adjusted to augment the gain inducing strain effect of the source/drain extension 500 upon the PFET channel 122.

The second epitaxial layer 800 can be made from a selective epitaxial growth method that forms epitaxial regions within the recess 700. Generally, the second epitaxial layer 800 may include any material that imparts strain to the PFET channel 122 and/or augments strain introduced by the source/drain extension 500 to the PFET channel 122. It will be appreciated by those skilled in the art that an appropriately applied strain to the channel region of a transistor device may enhance the amount of current that can flow through the device.

As an exemplary illustration, the second epitaxial layer 800 may include semiconducting materials, such as silicon and germanium. In an aspect of the embodiment, the second epitaxial layer 800 may include Si, SiGe, SiGeC, or a combination thereof. In a preferred aspect of the embodiment, the second epitaxial layer 800 employs a silicon-germanium layer with a germanium concentration of about 10 to about 20 atomic percent. Moreover, the second epitaxial layer 800 can optionally be either undoped or doped with a p-type dopant that is selected from Group IIIA of the Periodic Table of Elements, preferably boron.

However it is to be understood that the second epitaxial layer 800 is not to be limited to any particular type of material, germanium concentration, or dopant. In accordance with the present embodiment, the second epitaxial layer 800 may include any material, germanium concentration, or dopant that is strategically engineered and designed to provide gain inducing strain within the PFET channel 122 of the integrated circuit system 100.

The second epitaxial layer 800 may be deposited with a thickness of about 50 nanometers to about 100 nanometers, for example. However, it is to be understood that the thickness of the second epitaxial layer 800 deposited is not limited to the above exemplary range and may include any thickness that optimally induces strain within the PFET channel 122.

Figure 9:
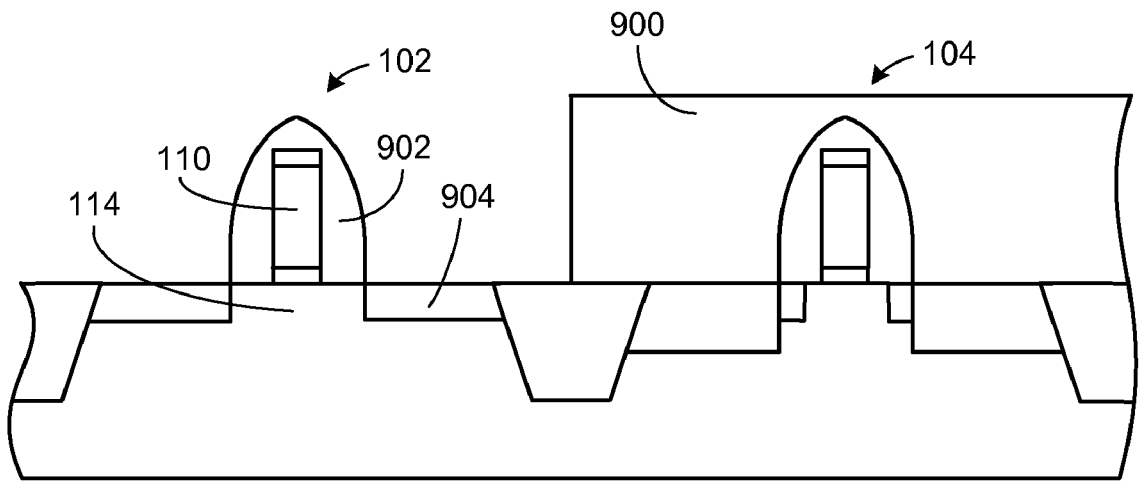
FIG. 9 is the structure of FIG. 8 after further processing.

Referring now to FIG. 9, therein is shown the structure of FIG. 8 after further processing. A mask layer 900, such as silicon oxide or silicon nitride, is formed over the PFET device 104 and the second insulation layer 600, of FIG. 6, that remains over the NFET device 102 is selectively removed by an etch process that forms an NFET gate sidewall spacer 902. By way of example, the etch process may include a dry etch process, such as reactive ion etching. However, it is to be understood that the etch process of the present embodiment is not to be limited to reactive ion etching and the etch method may include any etch process that selectively removes the remaining portions of the second insulation layer 600.

After forming the NFET gate sidewall spacer 902, a medium to high dose implant may be performed to form an NFET source/drain 904. Notably, the NFET source/drain 904 can be aligned to the NFET gate sidewall spacer 902, thereby accurately controlling the proximity of the NFET source/drain 904 to the NFET gate 110 and/or the NFET channel 114. It will be appreciated by those skilled in the art that after forming the NFET source/drain 904 an optional NFET source and drain extension implant and an optional NFET halo implant can be performed on the NFET device 102.

It is to be understood that the mask layer 900 protects the PFET device 104 from the NFET source/drain 904 implant, optional extension and halo implants, and the etch process that forms the NFET gate sidewall spacer 902.

Figure 10:
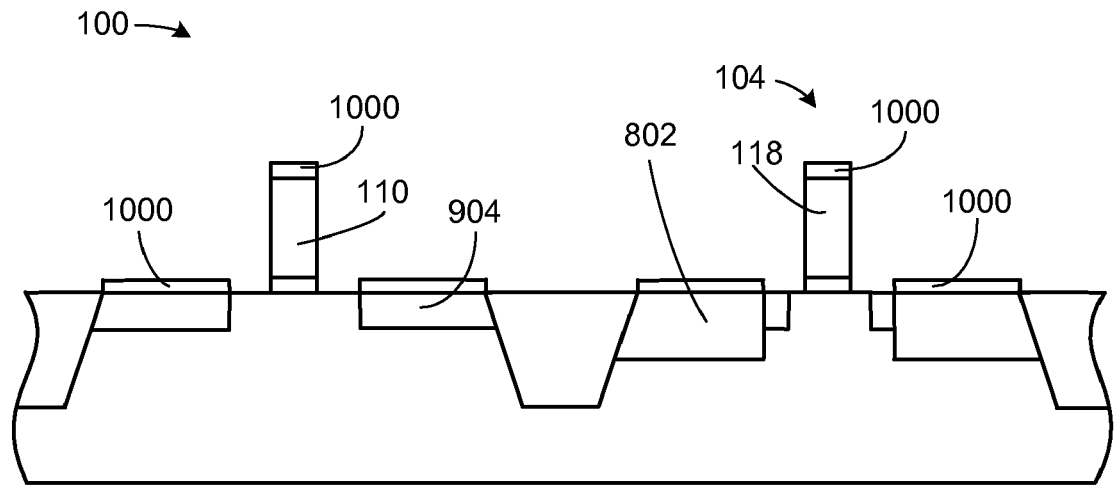
FIG. 10 is the structure of FIG. 9 after formation of a low resistance electrical contact.

Referring now to FIG. 10, therein is shown the structure of FIG. 9 after formation of a low resistance electrical contact 1000. Before forming the low resistance electrical contact 1000, the mask layer 900, of FIG. 9, is removed from over the PFET device 104, the NFET cap 108, of FIG. 1, can optionally be removed from over the NFET gate 110, and the PFET cap 116, of FIG. 1, can optionally be removed from over the PFET gate 118. By removing the mask layer 900, the NFET cap 108 and the PFET cap 116, the source/drain 802, the NFET gate 110 and the PFET gate 118 can be exposed for further processing.

To improve contact formation with the electrically conductive areas of the integrated circuit system 100, a silicide or salicide process may optionally be employed to form the low resistance electrical contact 1000. By way of example, the low resistance electrical contact 1000 can be formed over the NFET source/drain 904, the NFET gate 110, the source/drain 802, and the PFET gate 118. It is to be understood that the low resistance electrical contact 1000 may include any conducting compound that forms an interface between the NFET source/drain 904, the NFET gate 110, the source/drain 802, and the PFET gate 118 that is thermally stable and provides uniform electrical properties with low resistance. For purposes of illustration, the low resistance electrical contact 1000 may include materials such as, refractory metals (e.g.— cobalt, platinum, titanium, tungsten, tantalum, and molybdenum), nickel, nickel-platinum, or any type of silicide.

It is to be understood that the low resistance electrical contact 1000 can be formed before or after the removal of the NFET gate sidewall spacer 902, of FIG. 9, and the second PFET gate sidewall spacer 602, of FIG. 8. Furthermore, it is to be understood that additional processing steps, such as an optional PFET source and drain extension implant and an optional PFET halo implant can be performed on the PFET device 104 before removal of the second PFET gate sidewall spacer 602.

Figure 11:
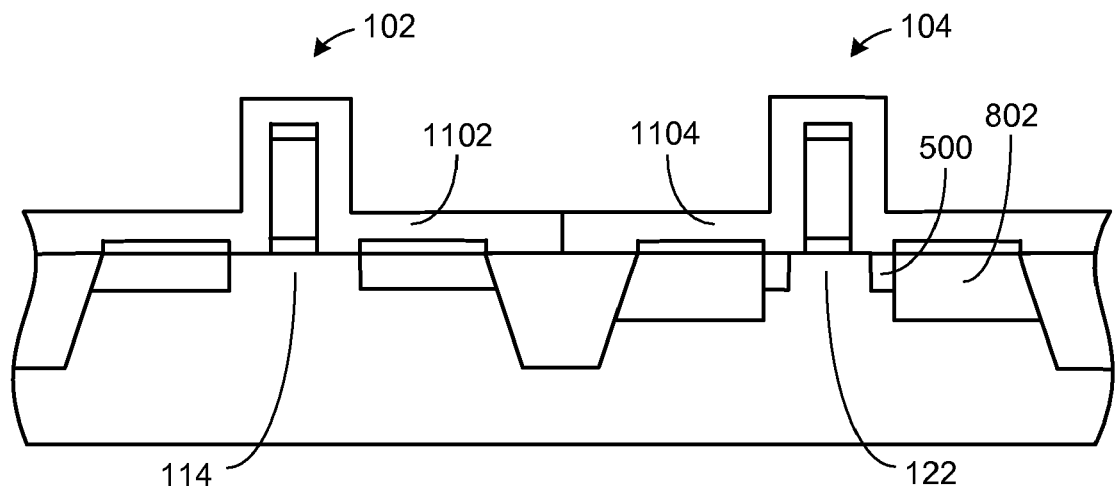
FIG. 11 is the structure of FIG. 10 after deposition of a first dielectric layer and a second dielectric layer.

Referring now to FIG. 11, therein is shown the structure of FIG. 10 after deposition of a first dielectric layer 1102 and a second dielectric layer 1104. The first dielectric layer 1102 is deposited over the NFET device 102 and may be engineered to promote a tensile strain within the NFET channel 114. By way of example, the first dielectric layer 1102 may include a silicon nitride layer deposited by a plasma enhanced chemical vapor deposition process. The tensile strain within the first dielectric layer 1102 can be modulated by deposition parameters, such as, reactant flow rates, pressure, RF power, etc.

The second dielectric layer 1104 is deposited over the PFET device 104 and may be engineered to promote a compressive strain within the PFET channel 122. By way of example, the second dielectric layer 1104 may include a silicon nitride layer deposited by a plasma enhanced chemical vapor deposition process. The compressive strain within the second dielectric layer 1104 can be modulated by deposition parameters, such as, reactant flow rates, pressure, RF power, etc. Notably, the second dielectric layer 1104 can augment and/or enhance the compressive strain effects of the source/drain extension 500 and the source/drain 802 upon the PFET channel 122.

FIGS. 12-22, which follow, depict by way of example and not by limitation, an exemplary process flow for the formation of an integrated circuit system and they are not to be construed as limiting. It is to be understood that a plurality of conventional processes that are well known within the art and not repeated herein, may precede or follow FIGS. 12-22. Moreover, it is to be understood that many modifications, additions, and/or omissions may be made to the below described process without departing from the scope or spirit of the claimed subject matter. For example, the process may include more, fewer, or other steps.

Figure 12:
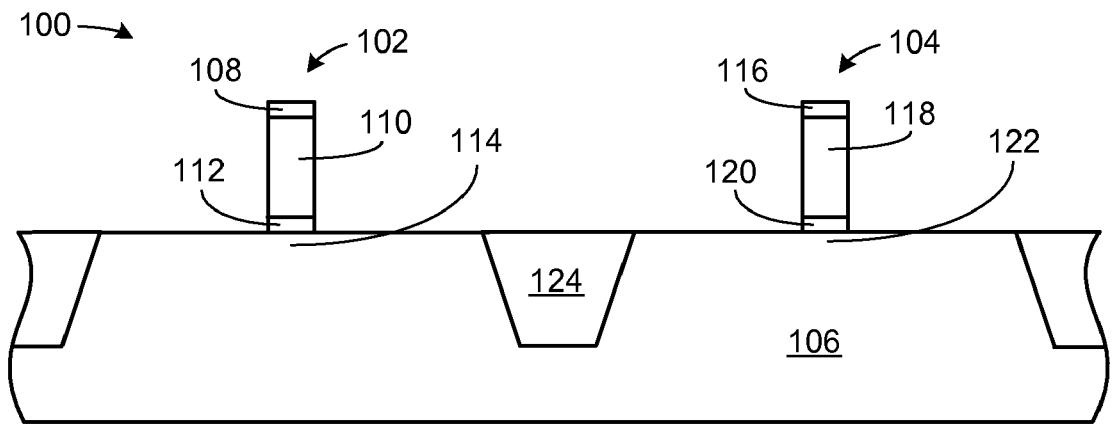
FIG. 12 is a cross sectional view of an integrated circuit system in an initial stage of manufacture, in accordance with another embodiment of the present invention.

Additionally, it is to be appreciated that the present disclosure need not be limited to the initial integrated circuit system depicted by FIG. 12. Accordingly, the present invention may include any p-channel multi-electrode device in which the current flowing between two specified electrodes is controlled or modulated by the voltage applied at a control electrode. For example, the p-channel multi-electrode device may include a p-channel field-effect-transistor (PFET), such as a single-gate transistor, a multi-gate transistor, a fin-FET, or an annular gate transistor. Moreover, it is to be understood that one or more of the integrated circuit system could be prepared at one time on a medium, which could then be separated into individual or multiple integrated circuit assemblies at a later stage of fabrication.

Referring now to FIG. 12, therein is shown a cross sectional view of the integrated circuit system 100 in an initial stage of manufacture, in accordance with another embodiment of the present invention. The integrated circuit system 100 can be formed from conventional deposition, patterning, photolithography, and etching to form the NFET device 102 and the PFET device 104. The NFET device 102 and the PFET device 104 may operate together, thereby forming a complementary metal-oxide-semiconductor (CMOS) configuration.

The NFET device 102 and the PFET device 104 are formed on and/or within the substrate 106. In an aspect of the present invention, the substrate 106 may include any semiconducting material, for example, Si, SiC, SiGe, Si/SiGe, SiGeC, Ge, GaAs, InAs, InP as well as other III/V or II/VI compound semiconductors. Moreover, the substrate 106 may also include silicon-on-insulator configurations.

In a preferred aspect of the embodiment, the substrate 106 is a silicon-containing substrate. The term "silicon-containing substrate" is used herein to denote a semiconductor material that includes at least silicon. Examples of a silicon-containing substrate include, but are not limited to: Si, SiGe, SiC, and/or SiGeC.

In alternative aspects of the embodiment, the substrate 106 may also include doped, undoped, or doped and undoped regions therein. The substrate 106 may also include one or more crystal orientations.

However, the examples provided for the substrate 106 are not to be construed as limiting and the composition of the substrate 106 may include any material that physically and electrically enables the formation of an active or passive device structure.

The NFET device 102 includes the NFET cap 108, the NFET gate 110, and the NFET gate dielectric 112. The NFET cap 108 is formed over the NFET gate 110 and protects the NFET gate 110 from subsequent processing steps and may include a dielectric material, such as silicon nitride, for example. The NFET gate 110 may be formed from conventional materials including doped and undoped semiconducting materials (such as, for example, polySi, amorphous Si, or SiGe), a metal, a metallic alloy, a silicide, or a combination thereof.

The NFET gate dielectric 112 may be made from materials including, but not limited to, silicon oxide, silicon oxynitride, silicon nitride, a silicon oxide/nitride/oxide stack or a high-k dielectric material (i.e.—one having a dielectric constant value greater than silicon oxide). However, it is to be understood that the type of material chosen for the NFET gate dielectric 112 is not limited to the above examples; for example, the NFET gate dielectric 112 may include any material that permits induction of a charge in the NFET channel 114 when an appropriate voltage is applied to the NFET gate 110.

The PFET device 104 includes the PFET cap 116, the PFET gate 118, and the PFET gate dielectric 120. The PFET cap 116 is formed over the PFET gate 118 and protects the PFET gate 118 from subsequent processing steps and may include a dielectric material, such as silicon nitride, for example. The PFET gate 118 may be formed from conventional materials including doped and undoped semiconducting materials (such as, for example, poly-silicon, amorphous silicon, or SiGe), a metal, a metallic alloy, a silicide, or a combination thereof.

The PFET gate dielectric 120 may be made from materials including, but not limited to, silicon oxide, silicon oxynitride, silicon nitride, a silicon oxide/nitride/oxide stack or a high-k dielectric material (i.e.—one having a dielectric constant value greater than silicon oxide). However, it is to be understood that the type of material chosen for the PFET gate dielectric 120 is not limited to the above examples; for example, the PFET gate dielectric 120 may include any material that permits induction of a charge in the PFET channel 122 when an appropriate voltage is applied to the PFET gate 118.

The substrate 106 may also include the isolation structure 124, such as a shallow trench isolation structure, which can electrically isolate and/or separate the NFET device 102 and the PFET device 104. For purposes of illustration, the isolation structure 124 may be made from a dielectric material such as silicon dioxide ("$SiO_2$").

Figure 13:
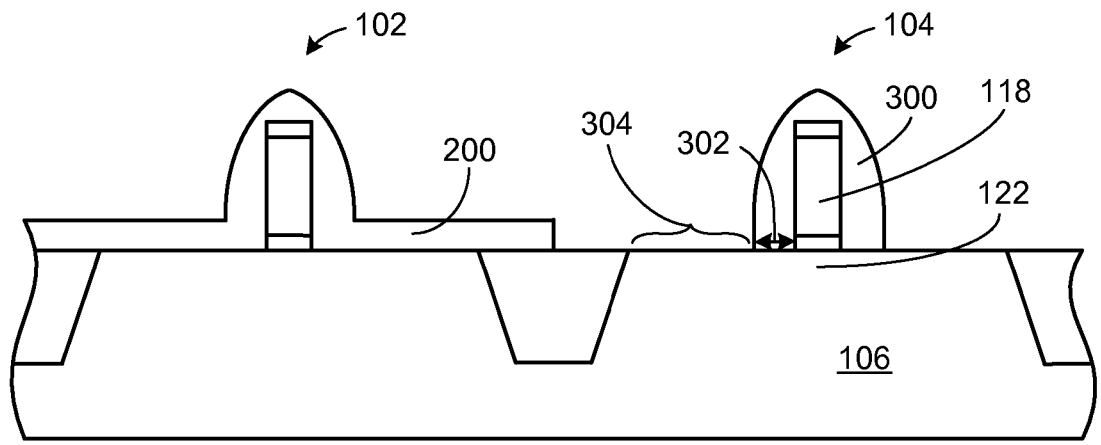
FIG. 13 is the structure of FIG. 12 after formation and selective etching of a first insulation layer.

Referring now to FIG. 13, therein is shown the structure of FIG. 12 after formation and selective etching of the first insulation layer 200. The first insulation layer 200 can be deposited over the NFET device 102, the PFET device 104, and the substrate 106 with a thickness of about 30 to about 60 nanometers. However, it is to be understood that the thickness of the first insulation layer 200 is not to be limited by the above exemplary range. In accordance with the scope of the present invention, the first insulation layer 200 may include any thickness and is only to be limited by the desired width of a subsequently formed gate sidewall spacer.

It is to be understood that by strategically controlling and modulating the thickness of the first insulation layer 200 that the width of subsequently formed gate sidewall spacers at the interface with the substrate 106 can be carefully controlled.

By way of example, the first insulation layer 200 may include dielectric materials such as a silicon dioxide or silicon nitride. However, it is to be understood that the present invention is not to be limited to this particular example. In accordance with the invention, the first insulation layer 200 may include any material that helps to block the deposition of a subsequent layer, such as a silicon germanium layer, for example.

The first insulation layer 200 is etched to form the first PFET gate sidewall spacer 300 by removing selected portions of the first insulation layer 200 formed adjacent the PFET device 104. After etching, the first PFET gate sidewall spacer 300 should have a first width dimension 302 (e.g.—a thickness) of about 30 nanometers to about 60 nanometers at its interface with the substrate 106.

However, it is to be understood that the present invention is not to be limited to the exemplary range provided above for the first width dimension 302. In accordance with the invention, the first width dimension 302 may include any thickness that optimizes the gain inducing strain effect that a subsequently deposited source and drain may have on the PFET channel 122.

Per this embodiment, the first width dimension 302 can be defined as the thickness of the first PFET gate sidewall spacer 300 at its interface with the substrate 106.

It is to be understood that the first width dimension 302 of the first PFET gate sidewall spacer 300 helps to determine an offset (e.g.—a distance substantially equivalent to the first width dimension 302) of the first active region 304 from the PFET gate 118. By selectively removing portions of the first insulation layer 200 (i.e.—by etching the first insulation layer 200 to form the first PFET gate sidewall spacer 300) the first active region 304 has been defined and exposed for further processing. It is to be understood that the first width dimension 302 is inversely correlated with the size of the first active region 304 exposed. For example, as the first width dimension 302 of the first PFET gate sidewall spacer 300 decreases, the size of the first active region 304 increases. The exposed portions of the first active region 304 may optionally undergo a cleaning step to remove surface contaminants, such as particles, organics and native oxides.

By way of example, the etch process used to selectively etch the first insulation layer 200 may include a dry etch process, such as reactive ion etching. However, it is to be understood that the etch process of the present embodiment is not to be limited to reactive ion etching and the etch method may include any etch process that selectively removes portions of the first insulation layer 200.

Figure 14:
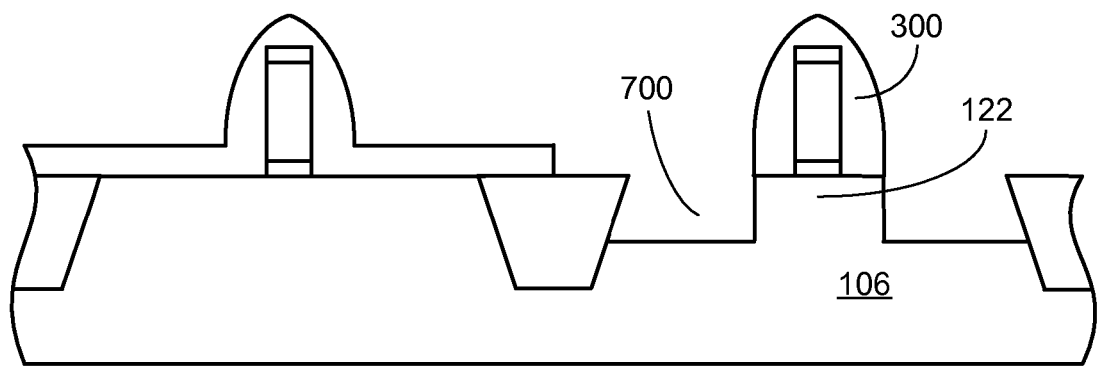
FIG. 14 is the structure of FIG. 13 after forming a recess within a substrate.

Referring now to FIG. 14, therein is shown the structure of FIG. 13 after forming the recess 700 within the substrate 106. During this process step, the recess 700 is formed by an etch process that is highly selective to the material chosen for the substrate 106. By way of example, the etch process may include a dry etch process, such as reactive ion etching, which selectively removes silicon. However, it is to be understood that the etch process of the present embodiment is not to be limited to reactive ion etching and the etch method may include any etch process that selectively removes portions of the substrate 106.

Generally, the depth of the recess 700 should exceed the depth of a subsequently formed source and drain extension and may, more specifically, range from about 50 nanometers to about 100 nanometers, for example. However, it is to be understood that the present invention is not to be limited to the exemplary range provided above for the depth of the recess 700. In accordance with the invention, the depth of the recess 700 may include any depth that optimizes the gain inducing strain effect that a subsequently deposited source and drain may have on the PFET channel 122.

Notably, the formation of the recess 700 can be aligned to the first PFET gate sidewall spacer 300, thereby helping to position a subsequently deposited source and drain epitaxial material that can act synergistically with the gain inducing strain caused by the formation of a subsequently formed source and drain extension.

Figure 15:
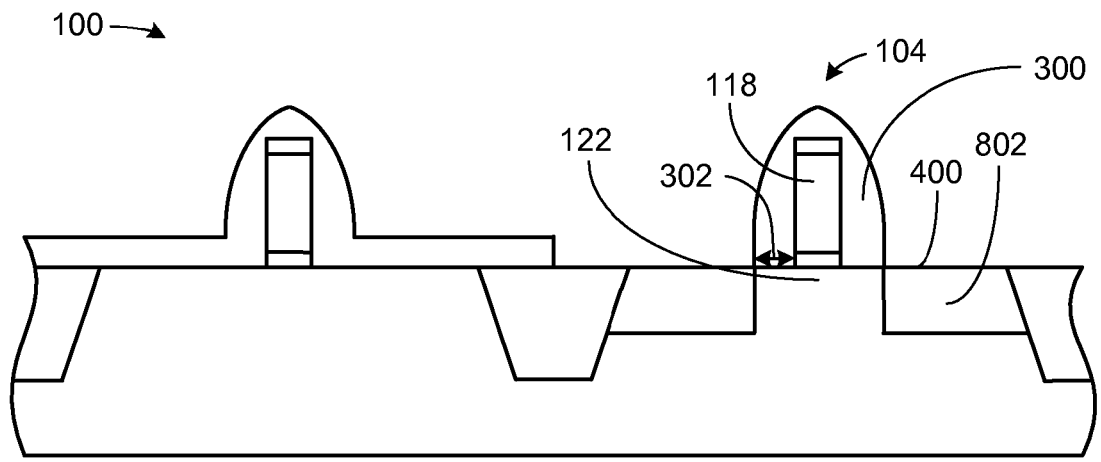
FIG. 15 is the structure of FIG. 14 after the selective formation of a first epitaxial layer within a recess.

Referring now to FIG. 15, therein is shown the structure of FIG. 14 after the selective formation of the first epitaxial layer 400 within the recess 700, of FIG. 14. After deposition, the first epitaxial layer 400 forms the source/drain 802 of the PFET device 104.

Notably, the proximity of the first epitaxial layer 400 (i.e.—the source/drain 802) to the PFET gate 118 and its effect on subsequently formed source and drain extensions can be controlled/determined by the first width dimension 302 of the first PFET gate sidewall spacer 300. It is to be understood that the offset of the first epitaxial layer 400 from the PFET gate 118 can be modified or adjusted to effectuate a particular result by altering the first width dimension 302. For example, the offset of the source/drain 802 from the PFET gate 118 can be modified or adjusted to induce strain within the PFET channel 122 and/or augment the gain inducing strain effect of a subsequently formed source and drain extension upon the PFET channel 122.

The first epitaxial layer 400 can be made from a selective epitaxial growth method that forms epitaxial regions within the recess 700. Generally, the first epitaxial layer 400 may include any material that imparts strain to the PFET channel 122 and/or augment strain introduced by a subsequently formed source and drain extension to the PFET channel 122. It will be appreciated by those skilled in the art that an appropriately applied strain to the channel region of a transistor device may enhance the amount of current that can flow through the device.

As an exemplary illustration, the first epitaxial layer 400 may include semiconducting materials, such as silicon and germanium. In an aspect of the embodiment, the first epitaxial layer 400 may include Si, SiGe, SiGeC, or a combination thereof. In a preferred aspect of the embodiment, the first epitaxial layer 400 employs a silicon-germanium layer with a germanium concentration of about 10 to about 20 atomic percent. Moreover, the first epitaxial layer 400 can optionally be either undoped or doped with a p-type dopant that is selected from Group IIIA of the Periodic Table of Elements, preferably boron.

However it is to be understood that the first epitaxial layer 400 is not to be limited to any particular type of material, germanium concentration, or dopant. In accordance with the present embodiment, the first epitaxial layer 400 may include any material, germanium concentration, or dopant that is strategically engineered and designed to provide gain inducing strain within the PFET channel 122 of the integrated circuit system 100.

The first epitaxial layer 400 may be deposited with a thickness of about 50 nanometers to about 100 nanometers, for example. However, it is to be understood that the thickness of the first epitaxial layer 400 deposited is not limited to the above exemplary range and may include any thickness that optimally induces strain within the PFET channel 122.

Figure 16:
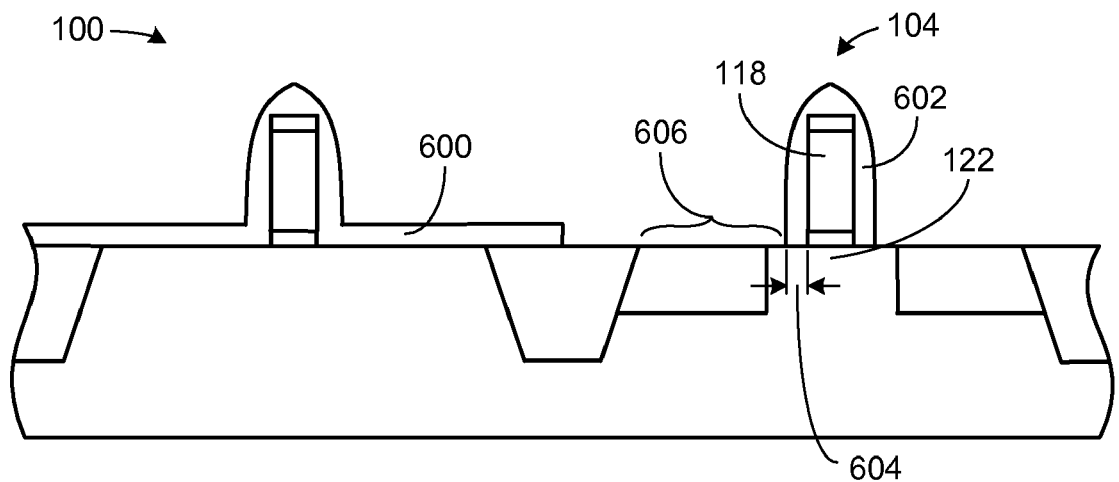
FIG. 16 is the structure of FIG. 15 after further processing.

Referring now to FIG. 16, therein is shown the structure of FIG. 15 after further processing. This illustration depicts the removal of the first insulation layer 200, of FIG. 13, and the first PFET gate sidewall spacer 300, of FIG. 15. By way of example, the first insulation layer 200 and the first PFET gate sidewall spacer 300 can be removed by a single step etch process or a multiple step etch process (e.g.—a wet or dry etch process) that is selective to the material chosen for each of the first insulation layer 200 and the first PFET gate sidewall spacer 300.

After removal of the first insulation layer 200 and the first PFET gate sidewall spacer 300, the second insulation layer 600 can be formed over the integrated circuit system 100. The second insulation layer 600 can be deposited over the NFET device 102, the PFET device 104, and the substrate 106 with a thickness of about 2 to about 20 nanometers. However, it is to be understood that the thickness of the second insulation layer 600 is not to be limited by the above exemplary range. In accordance with the scope of the present invention, the second insulation layer 600 may include any thickness and is only to be limited by the desired width of a subsequently formed gate sidewall spacer.

A subsequent etch process forms the second PFET gate sidewall spacer 602 by removing selected portions of the second insulation layer 600 formed adjacent the PFET device 104. After etching, the second width dimension 604 (e.g.—its thickness) of the second PFET gate sidewall spacer 602 should be about 2 nanometers to about 20 nanometers at its interface with the substrate 106.

However, it is to be understood that the present invention is not to be limited to the exemplary range provided above for the second width dimension 604. In accordance with the invention, the second width dimension 604 may include any thickness that optimizes the gain inducing strain effect that a subsequently deposited source and drain extension may have on the PFET channel 122.

Per this embodiment, the second width dimension 604 can be defined as the thickness of the second PFET gate sidewall spacer 602 at its interface with the substrate 106.

It is to be understood that the second width dimension 604 of the second PFET gate sidewall spacer 602 helps to determine an offset (e.g.—a distance substantially equivalent to the second width dimension 604) of the second active region 606 from the PFET gate 118. By selectively removing portions of the second insulation layer 600 (i.e.—by etching the second insulation layer 600 to form the second PFET gate sidewall spacer 602) the second active region 606 can be defined and exposed for further processing. It is to be understood that the second width dimension 604 is inversely correlated with the size of the second active region 606 exposed. For example, as the second width dimension 604 of the second PFET gate sidewall spacer 602 decreases, the size of the second active region 606 increases. The exposed portions of the second active region 606 may optionally undergo a cleaning step to remove surface contaminants, such as particles, organics and native oxides.

By way of example, the etch process used to selectively etch the second insulation layer 600 may include a dry etch process, such as reactive ion etching. However, it is to be understood that the etch process of the present embodiment is not to be limited to reactive ion etching and the etch method may include any etch process that selectively removes portions of the second insulation layer 600.

Figure 17:
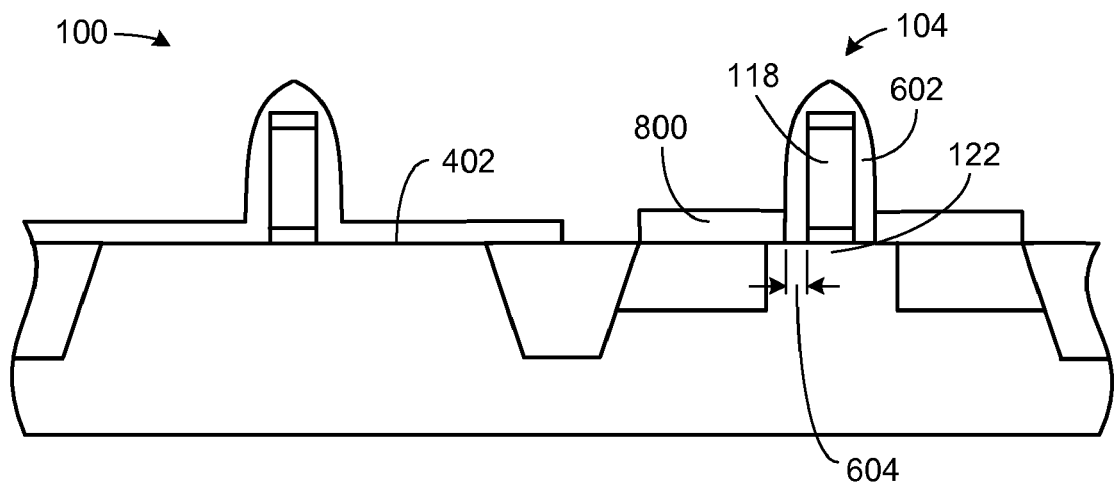
FIG. 17 is the structure of FIG. 16 after the selective formation of a second epitaxial layer over a second active region.

Referring now to FIG. 17, therein is shown the structure of FIG. 16 after the selective formation of the second epitaxial layer 800 over the second active region 606, of FIG. 16. Notably, the proximity of the second epitaxial layer 800 to the PFET gate 118 and its effect on subsequently formed source and drain extensions can be controlled/determined by the second width dimension 604 of the second PFET gate sidewall spacer 602. It is to be understood that the offset of the second epitaxial layer 800 from the PFET gate 118 can be modified or adjusted to effectuate a particular result by altering the second width dimension 604. For example, the offset of the second epitaxial layer 800 from the PFET gate 118 can be modified or adjusted to impact upon the proximity effect (e.g.—the gain inducing strain) that a subsequently formed source and drain extension may have upon the PFET channel 122.

The second epitaxial layer 800 can be made from a selective epitaxial growth method that forms raised epitaxial regions above the substrate top surface 402. Generally, the second epitaxial layer 800 may include any material that imparts strain to the PFET channel 122 of the PFET device 104. It will be appreciated by those skilled in the art that an appropriately applied strain to the channel region of a transistor device may enhance the amount of current that can flow through the device.

As an exemplary illustration, the second epitaxial layer 800 may include semiconducting materials, such as silicon and germanium. In an aspect of the embodiment, the second epitaxial layer 800 may include a silicon-germanium layer defined by the following formula: $Si_xGe_{1-x}$, wherein X may range from about 0.05 to about 0.99. In a preferred aspect of the embodiment, the second epitaxial layer 800 employs a silicon-germanium layer with a germanium concentration of about 1 to about 50 atomic percent. Moreover, the second epitaxial layer 800 can be either undoped or doped with a p-type dopant that is selected from Group IIIA of the Periodic Table of Elements, preferably boron.

However it is to be understood that the second epitaxial layer 800 is not to be limited to any particular type of material, germanium concentration, or dopant. In accordance with the present embodiment, the second epitaxial layer 800 may include any material, germanium concentration, or dopant that is strategically engineered and designed to provide gain inducing strain within the PFET channel 122 of the integrated circuit system 100.

The second epitaxial layer 800 may be deposited with a thickness of about 5 nanometers to about 50 nanometers, for example. However, it is to be understood that the thickness of the second epitaxial layer 800 deposited is not limited to the above exemplary range and may include any thickness that optimally induces strain within the PFET channel 122.

Figure 18:
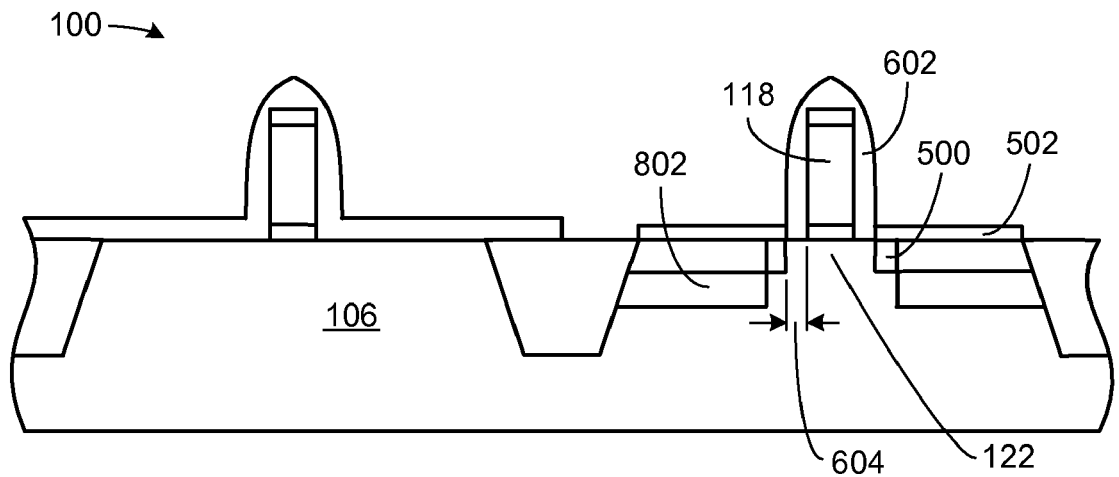
FIG. 18 is the structure of FIG. 17 after forming a source/drain extension.

Referring now to FIG. 18, therein is shown the structure of FIG. 17 after forming the source/drain extension 500. The source/drain extension 500 may include any material that imparts strain to the PFET channel 122 and may have a depth ranging from about 5 nanometers to about 50 nanometers. However, it is to be understood that the depth of the source/drain extension 500 is not limited to the above exemplary range and may include any depth that optimally induces strain within the PFET channel 122.

By way of example, the source/drain extension 500 may include a silicon-germanium layer formed via a germanium condensation process. More specifically, the germanium condensation process may include a dry oxidation process performed at elevated temperatures (e.g.—above 750° C.). During this process the second epitaxial layer 800, of FIG. 17, is exposed to an oxidation reaction, which forms the oxide layer 502 and the source/drain extension 500. It will be appreciated by those skilled in the art that a germanium condensation process can have the effect of driving germanium from the second epitaxial layer 800 into the substrate 106, thereby enabling the accurate formation of a silicon-germanium layer (i.e.—the source/drain extension 500) with the desired concentration of germanium.

It has been discovered by the present inventors that a germanium condensation process, as applied to the second epitaxial layer 800, enables the formation of the source/drain extension 500 with a germanium concentration of about 10 to about 100 atomic percent. However, it is to be understood that the source/drain extension 500 is not limited to the above germanium concentration and may include any germanium concentration that augments the strain introduced to the PFET channel 122 by the source/drain 802 and/or may include any germanium concentration that induces gain inducing strain within the PFET channel 122.

Notably, the present invention not only enables the formation of the source/drain extension 500 with a desired germanium concentration level, but it also permits the selective positioning of the source/drain extension 500 in close proximity to the PFET gate 118. The present invention achieves this objective by offsetting the source/drain extension 500 from the PFET gate 118 a distance substantially equivalent to the second width dimension 604 of the second PFET gate sidewall spacer 602. It is to be understood that the proximity effect (e.g.—the gain inducing strain) of the source/drain extension 500 can be accurately controlled by the second width dimension 604 of the second PFET gate sidewall spacer 602, thereby improving/enhancing the short channel performance characteristics of the integrated circuit system 100.

Moreover, it has been discovered by the present inventors that by employing the method described herein, that a high germanium concentration region (e.g.—the source/drain extension 500) can be formed without the dislocation effects/formations common to epitaxially formed high germanium concentration regions.

Figure 19:
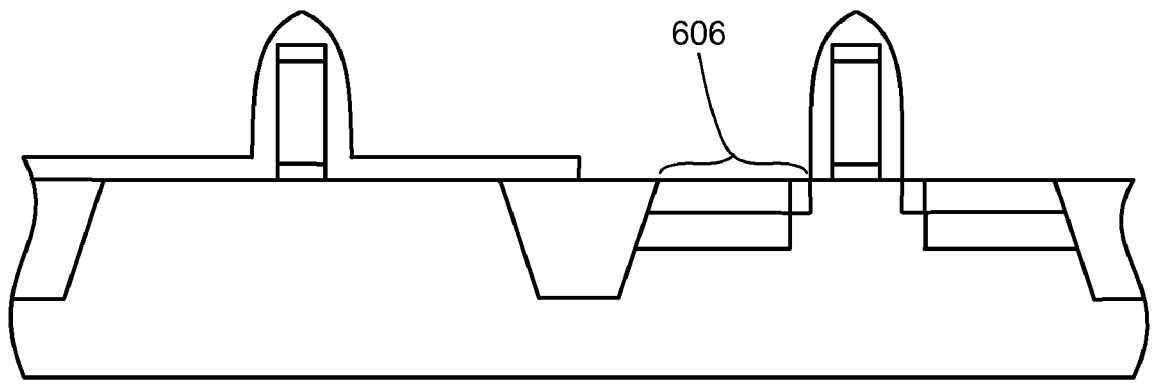
FIG. 19 is the structure of FIG. 18 after removal of an oxide layer.

Referring now to FIG. 19, therein is shown the structure of FIG. 18 after removal of the oxide layer 502, of FIG. 18. The oxide layer 502 may be removed by any etch process (e.g.—a wet or dry etch process) that is selective to the material of the oxide layer 502. The exposed portions of the second active region 606 may optionally undergo a cleaning step to remove surface contaminants, such as particles, organics and native oxides.

Figure 20:
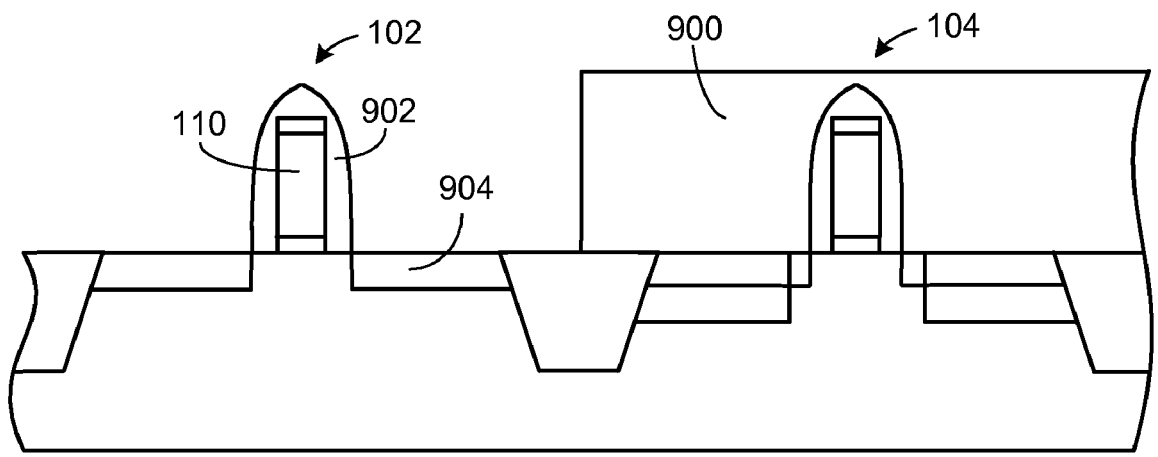
FIG. 20 is the structure of FIG. 19 after further processing.

Referring now to FIG. 20, therein is shown the structure of FIG. 19 after further processing. The mask layer 900, such as silicon oxide or silicon nitride, is formed over the PFET device 104, and the second insulation layer 600, of FIG. 16, that remains over the NFET device 102 is selectively removed by an etch process that forms the NFET gate sidewall spacer 902. By way of example, the etch process may include a dry etch process, such as reactive ion etching. However, it is to be understood that the etch process of the present embodiment is not to be limited to reactive ion etching and the etch method may include any etch process that selectively removes the remaining portions of the second insulation layer 600.

After forming the NFET gate sidewall spacer 902, a medium to high dose implant may be performed to form the NFET source/drain 904. Notably, the NFET source/drain 904 can be aligned to the NFET gate sidewall spacer 902, whose thickness can be optimized for accurately controlling the proximity of the NFET source/drain 904 to the NFET gate 110. It will be appreciated by those skilled in the art that after forming the NFET source/drain 904 an optional NFET source and drain extension implant and an optional NFET halo implant can be performed on the NFET device 102.

It is to be understood that the mask layer 900 protects the PFET device 104 from the NFET source/drain 904 implant, optional extension and halo implants, and the etch process that forms the NFET gate sidewall spacer 902.

Figure 21:
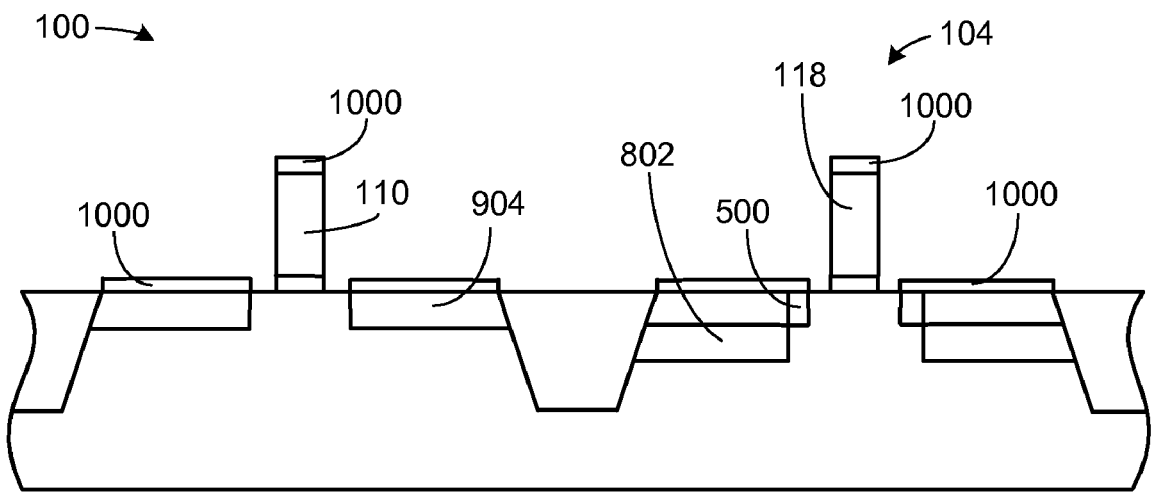
FIG. 21 is the structure of FIG. 20 after formation of a low resistance electrical contact.

Referring now to FIG. 21, therein is shown the structure of FIG. 20 after formation of the low resistance electrical contact 1000. Before forming the low resistance electrical contact 1000, the mask layer 900, of FIG. 20, is removed from over the PFET device 104, the NFET cap 108, of FIG. 1, can optionally be removed from over the NFET gate 110, and the PFET cap 116, of FIG. 1, can optionally be removed from over the PFET gate 118. By removing the mask layer 900, the NFET cap 108 and the PFET cap 116, the source/drain extension 500, the source/drain 802, the NFET gate 110 and the PFET gate 118 can be exposed for further processing.

To improve contact formation with the electrically conductive areas of the integrated circuit system 100, a silicide or salicide process may optionally be employed to form the low resistance electrical contact 1000. By way of example, the low resistance electrical contact 1000 can be formed over the NFET source/drain 904, the NFET gate 110, the source/drain extension 500, the source/drain 802, and the PFET gate 118. It is to be understood that the low resistance electrical contact 1000 may include any conducting compound that forms an interface between the NFET source/drain 904, the NFET gate 110, the source/drain extension 500, the source/drain 802, and the PFET gate 118 that is thermally stable and provides uniform electrical properties with low resistance. For purposes of illustration, the low resistance electrical contact 1000 may include materials such as, refractory metals (e.g.—cobalt, platinum, titanium, tungsten, tantalum, and molybdenum), nickel, nickel-platinum, or any type of silicide.

It is to be understood that the low resistance electrical contact 1000 can be formed before or after the removal of the NFET gate sidewall spacer 902, of FIG. 9, and the second PFET gate sidewall spacer 602, of FIG. 9. Additionally, it is to be understood that the low resistance electrical contact 1000 could be formed just over the source/drain 802 by reforming the first PFET gate sidewall spacer 300, of FIG. 13, thereby, ameliorating potential interference between the low resistance electrical contact 1000 and the PFET channel 122. Furthermore, it is to be understood that additional processing steps, such as an optional PFET source and drain extension implant and an optional PFET halo implant can be performed on the PFET device 104 before removal of the second PFET gate sidewall spacer 602, of FIGS. 18 and 20.

Figure 22:
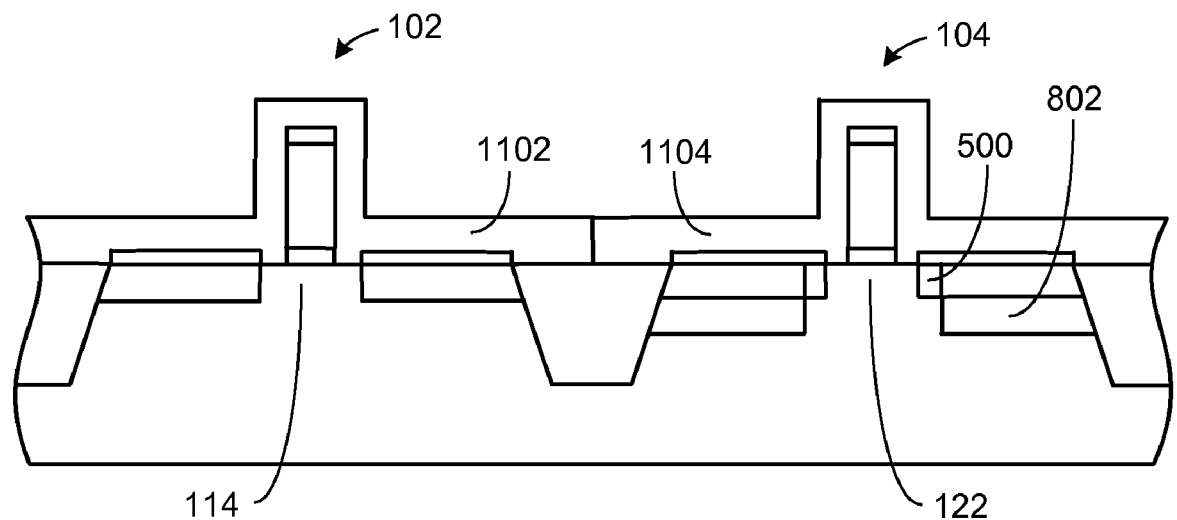
FIG. 22 is the structure of FIG. 21 after deposition of a first dielectric layer and a second dielectric layer.

Referring now to FIG. 22, therein is shown the structure of FIG. 21 after deposition of the first dielectric layer 1102 and the second dielectric layer 1104. The first dielectric layer 1102 is deposited over the NFET device 102 and may be engineered to promote a tensile strain within the NFET channel 114. By way of example, the first dielectric layer 1102 may include a silicon nitride layer deposited by a plasma enhanced chemical vapor deposition process. The tensile strain within the first dielectric layer 1102 can be modulated by deposition parameters, such as, reactant flow rates, pressure, RF power, etc.

The second dielectric layer 1104 is deposited over the PFET device 104 and may be engineered to promote a compressive strain within the PFET channel 122. By way of example, the second dielectric layer 1104 may include a silicon nitride layer deposited by a plasma enhanced chemical vapor deposition process. The compressive strain within the second dielectric layer 1104 can be modulated by deposition parameters, such as, reactant flow rates, pressure, RF power, etc. Notably, the second dielectric layer 1104 can augment and/or enhance the compressive strain effects of the source/drain extension 500 and the source/drain 802 upon the PFET channel 122.

Figure 23:
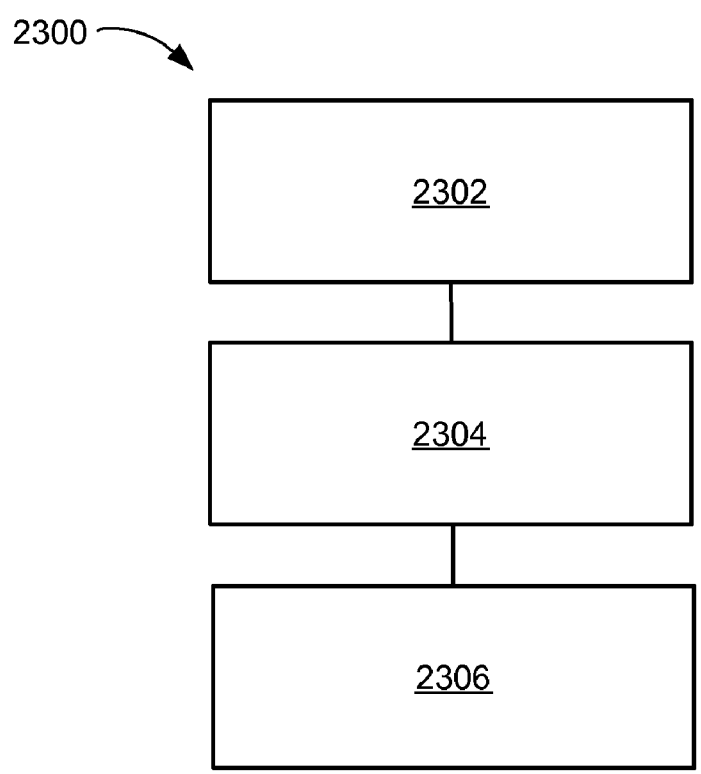
FIG. 23 is a flow chart of an integrated circuit system for an integrated circuit system in accordance with an embodiment of the present invention.

Referring now to FIG. 23, therein is shown a flow chart of an integrated circuit system 2300 for the integrated circuit system 100, in accordance with an embodiment of the present invention. The integrated circuit system 2300 includes providing a PFET device including a PFET gate and a PFET gate dielectric in a block 2302; forming a source/drain extension from a first epitaxial layer aligned to a first PFET gate sidewall spacer in a block 2304; and forming a source/drain from a second epitaxial layer aligned to a second PFET gate sidewall spacer in a block 2306.

It has been discovered that the present invention thus has numerous aspects. One such aspect is that the present invention enables the formation of source/drain extensions and source/drain regions with different germanium concentration levels. By forming the source/drain extensions and source/drain regions with different germanium concentration levels, the present invention can maximize the strain inducing effect (e.g.—gain) that each area has upon the channel region of an integrated circuit system.

Another aspect of the present invention is that it provides an integrated circuit system with a source/drain extension formed by a germanium condensation process. By forming the source/drain extension with a germanium condensation process, the germanium concentration within the source/drain extension can be accurately controlled.

Another aspect of the present invention is that it enables the formation of a source/drain extension without etching a recess within the substrate.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit system of the present invention furnishes important and heretofore unknown and unavailable solutions, capabilities, and functional aspects for enhancing device performance. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An integrated circuit system comprising:
   providing a PFET device including a PFET gate and a PFET gate dielectric;
   forming a source/drain extension having a higher germanium concentration than a source/drain from a first epitaxial layer aligned to a first PFET gate sidewall spacer; and
   forming the source/drain from a second epitaxial layer aligned to a second PFET gate sidewall spacer.

2. The system as claimed in claim 1 wherein:
   forming the source/drain extension from the first epitaxial layer includes a germanium condensation process.

3. The system as claimed in claim 1 wherein:
   forming the source/drain from the second epitaxial layer includes forming the second epitaxial layer in a recess.

4. The system as claimed in claim 1 further comprising:
   forming the first PFET gate sidewall spacer with a first width dimension that is smaller than a second width dimension of the second PFET gate sidewall spacer.

5. An integrated circuit system comprising:
   providing a PFET device including a PFET gate and a PFET gate dielectric;
   forming a source/drain from a first epitaxial layer aligned to a first PFET gate sidewall spacer; and
   forming a source/drain extension having a higher germanium concentration than the source/drain from a second epitaxial layer aligned to a second PFET gate sidewall spacer.

6. The system as claimed in claim 5 wherein:
   forming the source/drain extension from the second epitaxial layer includes a germanium condensation process.

7. The system as claimed in claim 5 wherein:
   forming the source/drain includes forming the source/drain with a germanium concentration of less than 20 atomic percent but greater than 10 atomic percent.

8. The system as claimed in claim 5 wherein:
   forming the source/drain extension includes forming the source/drain extension with a germanium concentration of greater than 20 atomic percent.

9. An integrated circuit system comprising:
   a PFET device including a PFET gate and a PFET gate dielectric;
   a source/drain extension with a first germanium concentration; and
   a source/drain with a second germanium concentration that is less than the first germanium concentration.

10. The system as claimed in claim 9 wherein:
    the source/drain extension is aligned to a first PFET gate sidewall spacer and the source/drain is aligned to a second PFET gate sidewall spacer.

11. The system as claimed in claim 9 wherein:
    the source/drain is aligned to a first PFET gate sidewall spacer and the source/drain extension is aligned to a second PFET gate sidewall spacer.

12. The system as claimed in claim 9 wherein:
    the first germanium concentration is greater than 20 atomic percent.

13. The system as claimed in claim 9 wherein:
    the second germanium concentration is less than 20 atomic percent but greater than 10 atomic percent.

14. The system as claimed in claim 9 wherein:
    the source/drain extension includes a germanium condensed silicon-germanium layer.

15. The system as claimed in claim 9 wherein:
    the source/drain includes a silicon-germanium layer.

16. The system as claimed in claim 9 wherein:
    the source/drain extension induces strain within a PFET channel.

17. The system as claimed in claim 9 wherein:
    the source/drain induces strain within a PFET channel.

18. The system as claimed in claim 9 wherein:
    the PFET device is part of a CMOS configuration.

* * * * *